(12) United States Patent  
Yoshikawa

(10) Patent No.: US 7,943,439 B2
(45) Date of Patent: May 17, 2011

(54) METHOD FOR MANUFACTURING SEMICONDUCTOR APPARATUS

(75) Inventor: Koh Yoshikawa, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 5 days.

(21) Appl. No.: 12/470,658

(22) Filed: May 22, 2009

(65) Prior Publication Data

US 2009/0291520 A1    Nov. 26, 2009

(30) Foreign Application Priority Data

May 22, 2008   (JP) .................................. 2008-134691

(51) Int. Cl.
*H01L 21/332*    (2006.01)
(52) U.S. Cl. ................ 438/133; 438/135; 257/E21.499; 257/E21.513
(58) Field of Classification Search ........... 257/E21.499, 257/E21.513, E21.514, E21.705, E21.512, 257/139, E29.197; 438/55, 133, 135
See application file for complete search history.

(56) References Cited

U.S. PATENT DOCUMENTS

| | | | |
|---|---|---|---|
| 4,142,115 A | | 2/1979 | Nakata et al. |
| 5,985,708 A | | 11/1999 | Nakagawa et al. |
| 6,046,470 A | * | 4/2000 | Williams et al. ............. 257/328 |
| 6,055,148 A | * | 4/2000 | Grover ........................ 361/103 |
| 6,313,529 B1 | * | 11/2001 | Yoshihara et al. ............ 257/724 |
| 6,818,470 B1 | * | 11/2004 | Acklin et al. .................. 438/55 |
| 6,872,635 B2 | * | 3/2005 | Hayashi et al. ............... 438/463 |
| 2002/0025604 A1 | * | 2/2002 | Tiwari .......................... 438/118 |
| 2002/0113247 A1 | * | 8/2002 | Magri et al. ................... 257/133 |
| 2003/0049915 A1 | * | 3/2003 | Abe et al. ..................... 438/455 |
| 2003/0057482 A1 | * | 3/2003 | Harada ......................... 257/329 |
| 2003/0119219 A1 | * | 6/2003 | Farcy et al. ..................... 438/51 |
| 2004/0061176 A1 | | 4/2004 | Takafuji et al. |
| 2004/0144992 A1 | * | 7/2004 | Willmeroth et al. .......... 257/107 |
| 2005/0045945 A1 | | 3/2005 | Yoshikawa et al. |
| 2009/0140289 A1 | * | 6/2009 | Torii ............................ 257/143 |

FOREIGN PATENT DOCUMENTS

| | | |
|---|---|---|
| JP | 52-072183 | 6/1977 |
| JP | 05-021706 B2 | 1/1993 |
| JP | 06-117942 A | 4/1994 |
| JP | 07-297392 A | 11/1995 |
| JP | 10-041510 A | 2/1998 |
| JP | 10-256542 A | 9/1998 |
| JP | 11-067820 A | 3/1999 |
| JP | 2004-165600 A | 6/2004 |
| JP | 2004-335719 A | 11/2004 |

* cited by examiner

*Primary Examiner* — Caridad M Everhart

(74) *Attorney, Agent, or Firm* — Rossi, Kimms & McDowell LLP

(57) ABSTRACT

A manufacturing method is provided for manufacturing a semiconductor apparatus including a main semiconductor device and a subsidiary semiconductor device, which facilitates preventing characteristics variations from causing and reducing the manufacturing costs. The method includes forming p-type well region in the surface portion of single-crystal semiconductor substrate of a main semiconductor device, mounting a single-crystal silicon diode above p-type well region with an insulator film interposed between diode and p-type well region for forming subsidiary semiconductor device, forming an insulator film on the main semiconductor device such that single-crystal silicon diode is covered with insulator film for fixing single-crystal silicon diode to single-crystal semiconductor substrate, and forming a metal film on the main semiconductor device for further forming a cathode side wiring on n-type cathode region in single-crystal silicon diode and an anode side wiring on p-type anode region in single-crystal silicon diode.

15 Claims, 16 Drawing Sheets

METHOD FOR MANUFACTURING SEMICONDUCTOR APPARATUS

BACKGROUND

The present invention relates to methods for manufacturing power semiconductor apparatuses used in power converters. Specifically, the present invention relates to the methods for manufacturing power semiconductor apparatuses including a main power semiconductor device and a subsidiary semiconductor device provided for the main power semiconductor device in a subordinate or additional manner.

The functions and performances of the power semiconductor apparatuses used in power converters have been improving recently. For example, power semiconductor apparatuses, which include a main semiconductor device and a subsidiary semiconductor device connected in a subordinate or additional manner onto the main semiconductor device surface, have been proposed. The subsidiary semiconductor device is formed by growing a polycrystalline semiconductor layer and by patterning the polycrystalline semiconductor layer or by implanting impurity ions into the polycrystalline semiconductor layer (see, for example, Japanese Unexamined Patent Application Publication No. Hei. 6 (1994)-117942).

A diode for temperature detection (hereinafter referred to as a "temperature detector diode") is formed, using a polycrystalline semiconductor layer, on the surface of the power semiconductor apparatus disclosed in Japanese Unexamined Patent Application Publication No. Hei. 6 (1994)-117942 for protecting the power semiconductor apparatus against overheating. The temperature detector diode performs overheat protection utilizing the changes of the forward diode characteristics or the reverse diode characteristics thereof by the temperature. Since the forward voltage of a diode changes almost linearly with temperatures, the temperature of a power semiconductor apparatus can be detected by making a constant current flow through the temperature detector diode and by monitoring the forward voltage of the temperature detector diode.

Japanese Unexamined Patent Application Publication No. Hei. 10 (1998)-41510 discloses a semiconductor apparatus, which includes an insulated gate bipolar transistor (hereinafter referred to as an "IGBT") and a temperature detector diode formed in the bulk section of the IGBT using a single-crystal semiconductor layer. The semiconductor apparatus disclosed in the above-referenced document utilizes the temperature dependence of the forward voltage drop across the temperature detector diode for detecting the IGBT temperature.

A semiconductor apparatus that has a chip on chip (hereinafter referred to as a "COC") structure formed of a sensor chip bonded with a solder onto a circuit chip has been proposed (see Japanese Unexamined Patent Application Publication No. Hei. 11 (1999)-67820). A technique for connecting one of the electrodes of a diode directly to a part of an IGBT has been proposed (see Japanese Unexamined Patent Application Publication No. 2004-335719). This technique facilitates improving the performances of a semiconductor device by utilizing the forward diode characteristics or reverse diode characteristics.

Outside the field of power semiconductor apparatuses, a technique for combining a single-crystal silicon section and a polycrystalline silicon section in a liquid-crystal display apparatus driven by a thin film transistor active matrix (hereinafter referred to as a "TFT active matrix") has been proposed (see Japanese Unexamined Patent Application Publication No. 2004-165600). The technique bonds a single-crystal silicon device in the manufacturing process thereof to an insulator substrate, thins the single crystal silicon to be a thin film, and grows polycrystalline silicon.

The technique disclose in the Japanese Unexamined Patent Application Publication No. Hei. 6 (1994)-117942 forms a polycrystalline semiconductor layer on a main power semiconductor device and, then, forms a subsidiary semiconductor device by patterning or by ion implantation, which requires many man-hours of effort. Since the subsidiary semiconductor device is manufactured using a polycrystalline semiconductor layer, the subsidiary semiconductor device manufactured as described above (hereinafter referred to as the "polycrystalline diode") exhibits inferior characteristics, due to the crystallinity of the polycrystalline semiconductor layer, to the characteristics, which the semiconductor device manufactured using a single-crystal semiconductor layer (hereinafter referred to as a "single-crystal diode") exhibits. Since variations are caused in the device characteristics and the built-in potential lowering is caused, it is impossible for the polycrystalline diode to successfully attain the primary targets, which the subsidiary semiconductor device is designed to attain. More specifically, when three diodes are connected in series, for example, and a predetermined current is made to flow through the diodes, the characteristics variation caused in the single-crystal diodes is suppressed within ±10 mV at 2.0 V, but a characteristics variation of ±40 mV is caused at 2.0 V in the polycrystalline diodes.

It is necessary for the technique disclosed in the Japanese Unexamined Patent Application Publication No. Hei. 10 (1998)-41510 to consider the interaction between the IGBT and the built-in diode in forming the built-in diode in the IGBT, whish also requires many man-hours of effort. Since it is necessary to form multiple diffusion layers in the main power semiconductor device and since the p-layers or n-layers diffuse outward, the impurity concentrations are lowered and the characteristics are impaired.

Since it is necessary for the technique disclosed in Japanese Unexamined Patent Application Publication No. Hei. 11 (1999)-67820 to form an electrode for soldering on the electrode plane of a main power semiconductor device, the active region area of the main power semiconductor device is reduced. Since the emitter electrode and the electrode connected to a floating layer are formed separately, it is necessary to extend the wiring between the emitter electrode and the emitter electrode pad or to extend the wiring between the electrode connected to the floating layer and the electrode pad connected to the floating layer. Since resistance is caused in the extended portion of the wiring, the electrical characteristics are impaired.

For obtaining the desired characteristics by the technique disclosed in Japanese Unexamined Patent Application Publication No. 2004-335719, it is necessary to connect a plurality of devices in series. Therefore, a wide device area is required.

Since it is necessary for the technique disclosed in Japanese Unexamined Patent Application Publication No. 2004-165600 to precisely implant hydrogen ions into a predetermined depth in a single-crystal silicon layer in advance. Therefore, the manufacturing steps are complicated. Since the device in the polycrystalline section is formed after a thick silicon single crystal is bonded, it is necessary to peel off most parts of the thick silicon single crystal. Powders are caused by the pealing off and the powders caused affect adversely the main power semiconductor device on the way of the manufacture thereof.

Although it may be considered to change the polycrystalline diode to a single-crystal diode in the technique disclosed in Japanese Unexamined Patent Application Publication No. 2004-165600, it is difficult to change the polycrystalline semiconductor layer to a single-crystal semiconductor layer. The reason for this is described below. When a silicon on insulator substrate (hereinafter referred to as a "SOI substrate") and such a substrate are used, the area ratio of the main power semiconductor device to the subsidiary semiconductor device is large. Therefore, the ratio of the SOI section to be removed is large. Thus, the exchange of the polycrystalline diode to a single-crystal diode causes inefficiency and high manufacturing costs.

In view of the foregoing, it would be desirable to obviate the problems described above. It would be also desirable to provide a semiconductor apparatuses, including a main semiconductor device and a subsidiary semiconductor device provided for the main semiconductor device, which facilitates preventing characteristics variations from causing and reducing the manufacturing costs thereof.

SUMMARY OF THE INVENTION

A method for manufacturing a semiconductor apparatus is provided that includes a main semiconductor device and a subsidiary semiconductor device provided for the main semiconductor device in a subordinate or additional manner; the method includes, mounting the subsidiary semiconductor device on the substrate of the main semiconductor device, and conducting a common treatment to the main semiconductor device and the subsidiary semiconductor device in the state, in which the subsidiary semiconductor device is on the main semiconductor device, for fixing the subsidiary semiconductor device to the main semiconductor device.

Preferably, the common treatment includes forming an insulator film on the main semiconductor device and the subsidiary semiconductor device and fixing the subsidiary semiconductor device to the main semiconductor device through the insulator film.

Still further, the subsidiary semiconductor device is preferably covered with the insulator film during the common treatment.

The method further preferably includes forming a metal film on the main semiconductor device and the subsidiary semiconductor device, wherein the formation of the metal film is conducted after the common treatment.

The method further preferably includes forming openings at the predetermined positions in the insulator film, wherein the formation of the openings is conducted between the common treatment and the formation of the metal film. The main semiconductor device and a part of the subsidiary semiconductor device are connected electrically to each other through the openings.

The method further preferably includes implanting ions to the substrate and thermally treating the substrate for forming semiconductor regions of predetermined conductivity types constituting the main semiconductor device, wherein the ion implantation is conducted in advance to the mounting of the subsidiary semiconductor device on the substrate of the main semiconductor device on the way of the manufacture thereof.

The method further includes forming an oxide film on the substrate, wherein the formation of oxide film on the substrate is conducted in advance to the mounting of the subsidiary semiconductor device on the substrate of the main semiconductor device, and the subsidiary semiconductor device, at least on one surface thereof an oxide film is formed, is positioned with the oxide film formed at least on one surface thereof underlying and mounted on the oxide film formed on the substrate.

The method further includes forming an oxide film on the substrate after ion implantation occurs and before the mounting occurs, and the subsidiary semiconductor device, at least on one surface thereof an oxide film is formed, is positioned with the oxide film formed at least on one surface thereof underlying and mounted on the oxide film formed on the substrate.

The method further preferably includes (g) polishing and etching the substrate from the back surface side thereof to thin the substrate, wherein the etching is performed after the common treatment is conducted.

The method further preferably includes (g) polishing and etching the substrate from the back surface side thereof to thin the substrate, wherein the polishing and etching is conducted after the metal film is formed.

According to the subject matter of the appended claim 11 the main semiconductor device and the subsidiary semiconductor device are made of a single crystal semiconductor.

In one embodiment, the main semiconductor device is preferably an insulated gate bipolar transistor.

In a further embodiment, the subsidiary semiconductor device is preferably a diode.

In a still further embodiment, the subsidiary semiconductor device is preferably a diode for temperature detection.

In addition, the subsidiary semiconductor device is preferably a diode that assists the main semiconductor device in ejecting excess carriers from the main semiconductor device.

The main semiconductor device and the subsidiary semiconductor device are preferably made of different semiconductor materials in one embodiment. In such a case, the, the band gap of the subsidiary semiconductor device is preferably wider than the band gap of the main semiconductor device.

According to the invention, a semiconductor apparatus including a main semiconductor device and a subsidiary semiconductor device is formed by mounting the subsidiary semiconductor device on the substrate of the main semiconductor device on the way of the manufacture thereof, by conducting the common steps common to the main and subsidiary semiconductor devices, and by fixing the subsidiary semiconductor device to the main semiconductor device while completing the main and subsidiary semiconductor devices. Therefore, it is possible to fix subsidiary semiconductor device to the main semiconductor device without adding any new process step.

Since it is possible to manufacture the subsidiary semiconductor device separately from the main semiconductor device, an arbitrary subsidiary semiconductor device made of an arbitrary kind of semiconductor may be used with no problem. For example, a subsidiary semiconductor device made of a single-crystal semiconductor may be fixed by a simple method to a main semiconductor device made of a single-crystal semiconductor. It is possible to mount a subsidiary semiconductor device, the characteristics thereof have been inspected, onto a main semiconductor device. Therefore, a defective device may be omitted and the throughput of non-defective products is improved. Since it is possible to manufacture many subsidiary semiconductor devices using a wafer different from the wafer for the main semiconductor device, the manufacturing costs can be reduced.

The manufacturing method according to the invention for manufacturing a semiconductor apparatus including a subsidiary semiconductor device mounted on a main semiconductor device facilitates preventing characteristics variations from causing and reducing the manufacturing costs.

Other features, advantages, objectives, modifications, etc., will become apparent to those skilled in the art from the following detailed description of the preferred embodiments of the invention and the accompanying drawings.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

Figure 1:
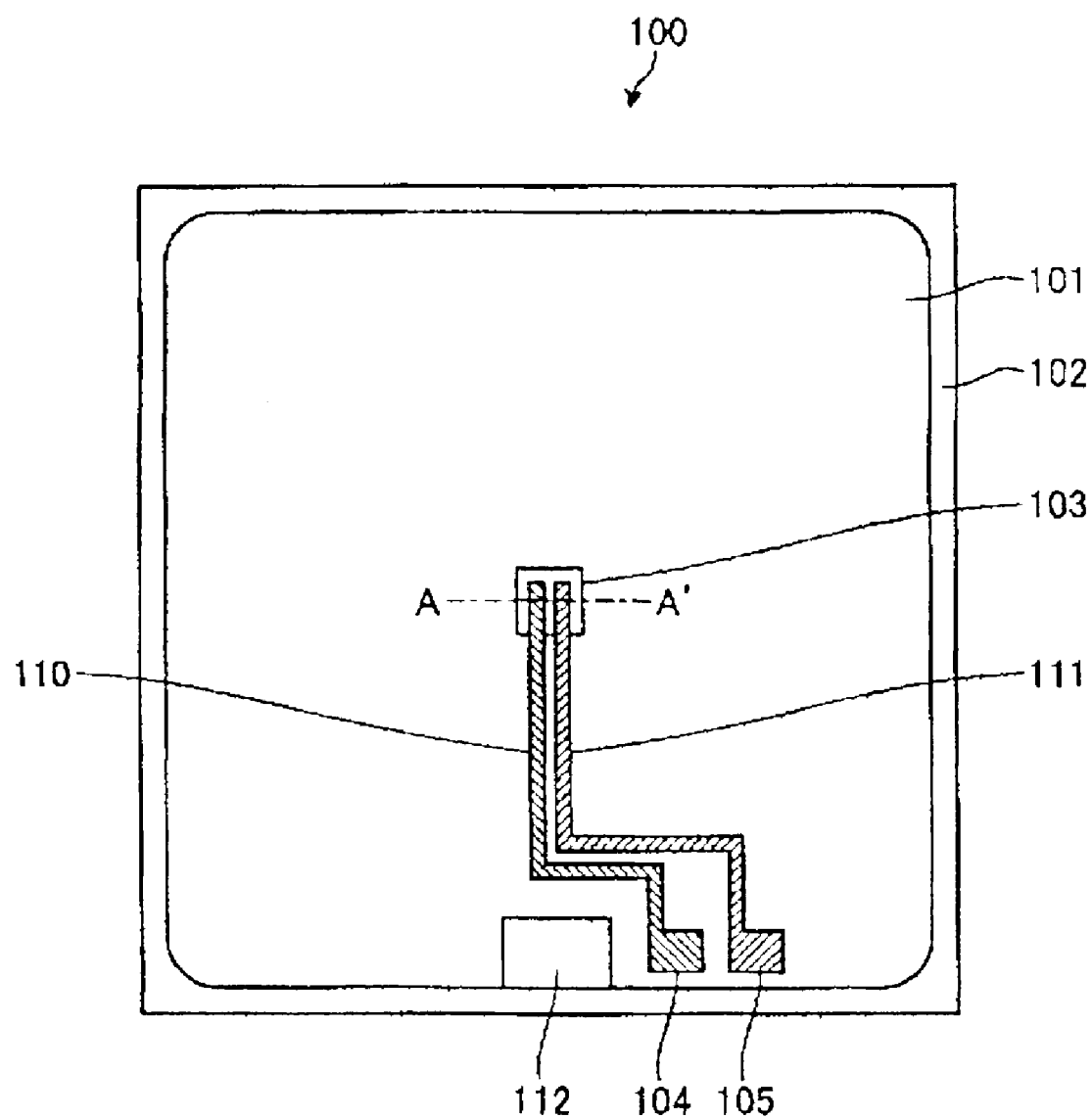
FIG. 1 is a top plan view of a semiconductor apparatus according to a first embodiment of the invention.

Now the invention will be described in detail hereinafter with reference to the accompanied drawings which illustrate the preferred embodiments of the invention. Throughout the accompanied drawings, the same reference numerals are used to designate the same constituent elements and their duplicated descriptions are omitted for the sake of simplicity.

Figure 2:
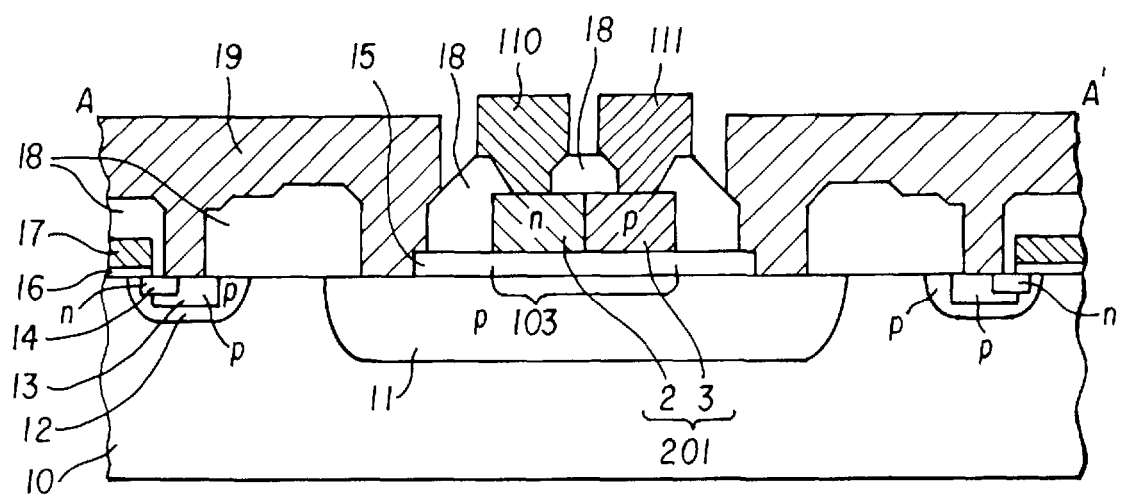
FIG. 2 is a cross sectional view showing the cross sectional structure along the line segment A-A' in FIG. 1.

FIG. 1 is a top plan view of a semiconductor apparatus according to a first embodiment of the invention. FIG. 2 is a cross sectional view showing the cross sectional structure along the line segment A-A' in FIG. 1. The semiconductor apparatus according to the first embodiment includes exemplary an IGBT as a main semiconductor device and a temperature detector diode as a subsidiary semiconductor device. In FIG. 1, the structure of the main semiconductor device is not shown for clearly showing the structure of the subsidiary semiconductor device.

As shown in FIG. 1, the semiconductor apparatus according to the first embodiment includes semiconductor chip 100, in which the main semiconductor device and the subsidiary semiconductor device provided for the main semiconductor device in a subordinate or additional manner are formed. Semiconductor chip 100 includes active region 101 formed of the main semiconductor device and edge termination 102 surrounding active region 101. Gate pad 112 is formed in the circumference portion of active region 101 such that gate pad 112 is in contact with edge termination 102. Subsidiary semiconductor device 103 is formed at an arbitrary location in active region 101. Cathode pad 104 and anode pad 105, connected electrically to the cathode side and the anode side of subsidiary semiconductor device 103 via wirings 110 and 111 respectively, are formed in the circumference portion of active region 101.

The chip area occupied by the main semiconductor device is around 12 mm×12 mm, for example. The area of the subsidiary semiconductor device is around 0.1 mm×0.1 mm. Therefore, the area of the subsidiary semiconductor device is much narrower than the chip area.

As shown in FIGS. 1 and 2, the main semiconductor device is manufactured using single-crystal semiconductor substrate 10. In the front side surface portion of single-crystal semiconductor substrate 10, p-type well region 11 is formed such that p-type well region 11 is spaced apart from p-type channel region 12. In p-type channel region 12, p-type body region 13 and n-type emitter region 14 are formed such that p-type body region 13 and n-type emitter region 14 are in contact with each other. Above n-type emitter region 14, gate electrode 17 is formed with gate oxide film 16 interposed between n-type emitter region 14 and gate electrode 17.

Metal film 19 is disposed on p-type body region 13 and a part of n-type emitter region 14. Metal film 19 is spaced apart from gate electrode 17 by insulator film 18 such as a borophospho silicate glass film (hereinafter referred to as a "BPSG film"). Above p-type well region 11, single-crystal silicon diode 201 is disposed with insulator film 15 interposed between p-type well region 11 and single-crystal silicon diode 201. This region works for a temperature detector diode, that is subsidiary semiconductor device 103. Single-crystal silicon diode 201 is spaced apart from metal film 19 by insulator film 18. Cathode-side wiring 110 is disposed on n-type cathode region 2 in single-crystal silicon diode 201. Anode-side wiring 111 is disposed on p-type anode region 3 in single-crystal silicon diode 201. Cathode-side wiring 110 and anode-side wiring 111 are spaced apart by insulator film 18.

Figure 3:
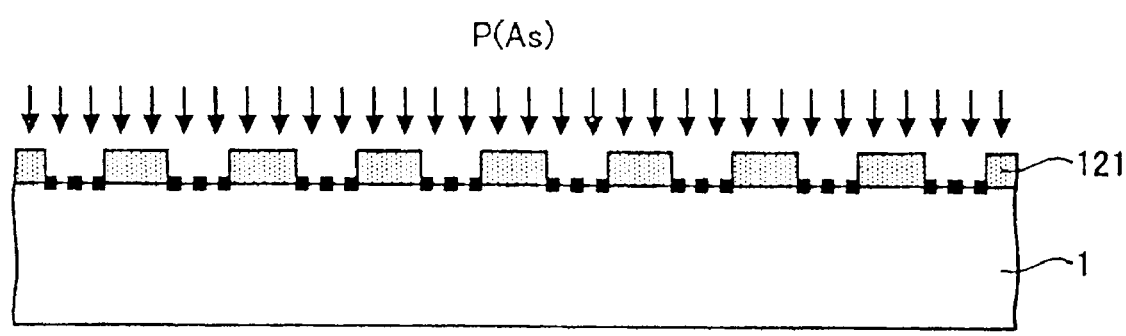
FIG. 3 is a cross sectional view describing the initial step for manufacturing a single-crystal silicon diode.
Figure 4:
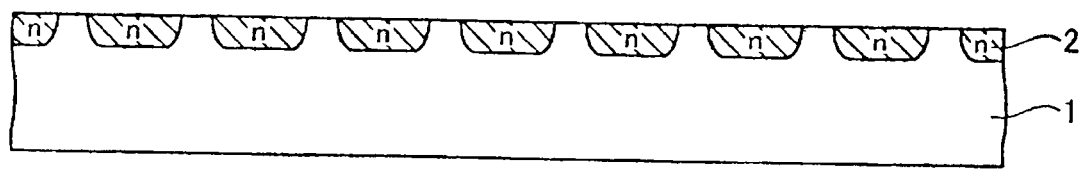
FIG. 4 is a cross sectional view describing the manufacturing step subsequent to the step described in FIG. 3.

Now the manufacturing method for manufacturing the single-crystal silicon diode for a subsidiary semiconductor device will be described below with reference to FIGS. 3 through 8. FIGS. 3 through 8 are cross sectional views describing the manufacturing steps for manufacturing a single-crystal silicon diode in the order of the manufacture. Referring at first to FIG. 3, the single-crystal silicon diode is manufactured using single-crystal semiconductor substrate 1. First, a resist film is formed on the front side surface of single-crystal semiconductor substrate 1 of n-type or p-type. Openings of 125 µm in width are formed in the resist film with equal spaces of, for example, 125 µm left between the openings to form first resist mask 121. Phosphorus (P) ions or arsenic (As) ions are implanted using first resist mask 121 for a mask. Then, first resist mask 121 is removed. Thus, heavily doped n-type cathode regions 2 are formed as shown in FIG. 4.

Figure 5:
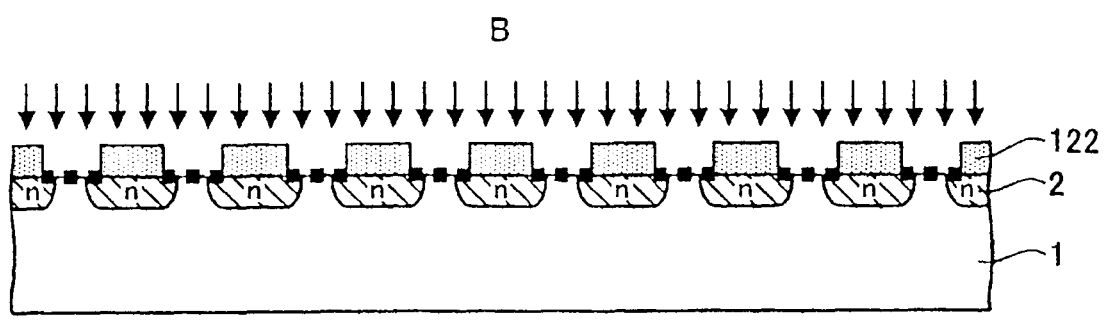
FIG. 5 is a cross sectional view describing the manufacturing step subsequent to the step described in FIG. 4.
Figure 6:
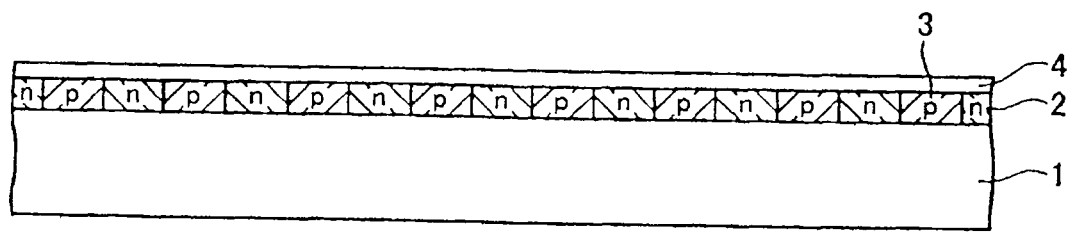
FIG. 6 is a cross sectional view describing the manufacturing step subsequent to the step described in FIG. 5.

Referring now to FIG. 5, a resist film is formed on the front-side surface of single-crystal semiconductor substrate 1. Openings of 125 µm in width are formed in the regions of the resist film including the regions, therein n-type cathode regions 2 are not formed, with equal spaces of, for example, 125 µm left between the openings to form second resist mask 122. Then, boron (B) ions are implanted using second resist mask 122 for a mask. Then, second resist mask 122 is removed. Thus, heavily doped p-type anode regions 3 are formed as shown in FIG. 6. Therefore, n-type cathode regions 2 and p-type anode regions 3 are formed alternately in the front side surface of single-crystal semiconductor substrate 1 with a center to center distance of 125 µm between the adjacent n-type cathode region 2 and p-type anode region 3. Then, oxide film 4 is formed on the front side surface of single-crystal semiconductor substrate 1.

Figure 7:
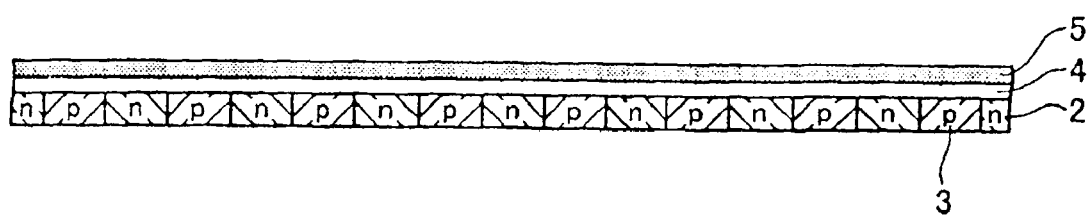
FIG. 7 is a cross sectional view describing the manufacturing step subsequent to the step described in FIG. 6.

Then, tape 5 is adhered onto oxide film 4 as shown in FIG. 7. Single-crystal semiconductor substrate 1 is polished or etched from the back surface side thereof so that the total thickness of oxide film 4 and n-type cathode region 2 or p-type anode region 3 may be 10 µm or less. Thus, single-crystal semiconductor substrate 1 is removed completely.

Figure 8:
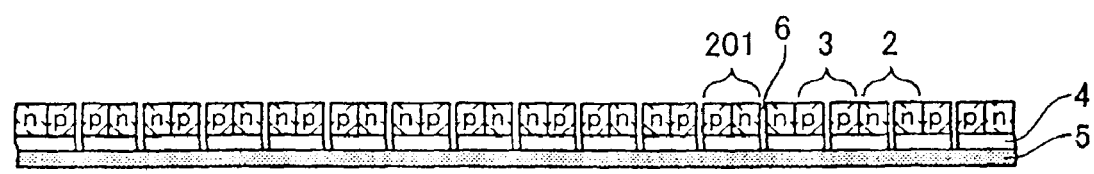
FIG. 8 is a cross sectional view describing the manufacturing step subsequent to the step described in FIG. 7.

The wafer, including n-type cathode region 2, p-type anode region 3, oxide film 4 on n-type cathode region 2 and p-type anode region 3, and tape 5 on oxide film 4, is turned over such that tape 5 is underlying as shown in FIG. 8. Then, the wafer is diced from the opposite side opposite to the side, on which tape 5 is adhered, along dicing line 6 almost centered between n-type cathode region 2 and p-type anode region 3. For example, dicing is conducted at intervals of 125 µm and at right angles. The dicing depth is controlled to be deep enough to completely cut oxide film 4 and n-type cathode region 2 or p-type anode region 3 but still shallow enough so as not to cut tape 5 completely. By the dicing, single-crystal silicon diodes 201 of about 95 µm square, each including an oxide film, are manufactured. The reason for obtaining single-crystal silicon diodes 201 of about 95 µm on one side thereof by the dicing conducted at intervals of 125 µm and at right angles is as follows. Since the blade used for dicing is, for example, about 30 µm in thickness, the cutting width of 15 µm, that is half the blade thickness, is caused on one side of the dice. In other words, the cutting width of 15 µm is caused on both sides of the dice facing opposite to each other.

Since the deviations caused in the intervals of dicing are, for example, equal to or less than 0.1 µm, the error caused in the dimensions of single-crystal silicon diodes 201 of about 95 µm square can be suppressed below 0.1%. Therefore, the characteristics of single-crystal silicon diodes 201 can be prevented from varying.

Then, tape 5 is pulled by a robot arm of a vacuum chuck type and such a means so that tape 5 may be peeled off easily. Then, tape 5 is peeled off from single-crystal silicon diodes 201. It is preferable to conduct electrical measurements on single-crystal silicon diodes 201, to select single-crystal silicon diodes 201, the results of the measurements thereof fall within the predetermined numerical value ranges, and to peel off only selected single-crystal silicon diodes 201. By selecting the diodes of a good quality in advance, the rate of good products after the subsidiary semiconductor devices (diodes) are incorporated into the respective main semiconductor devices (IGBT's) is prevented from lowering.

Figure 9:
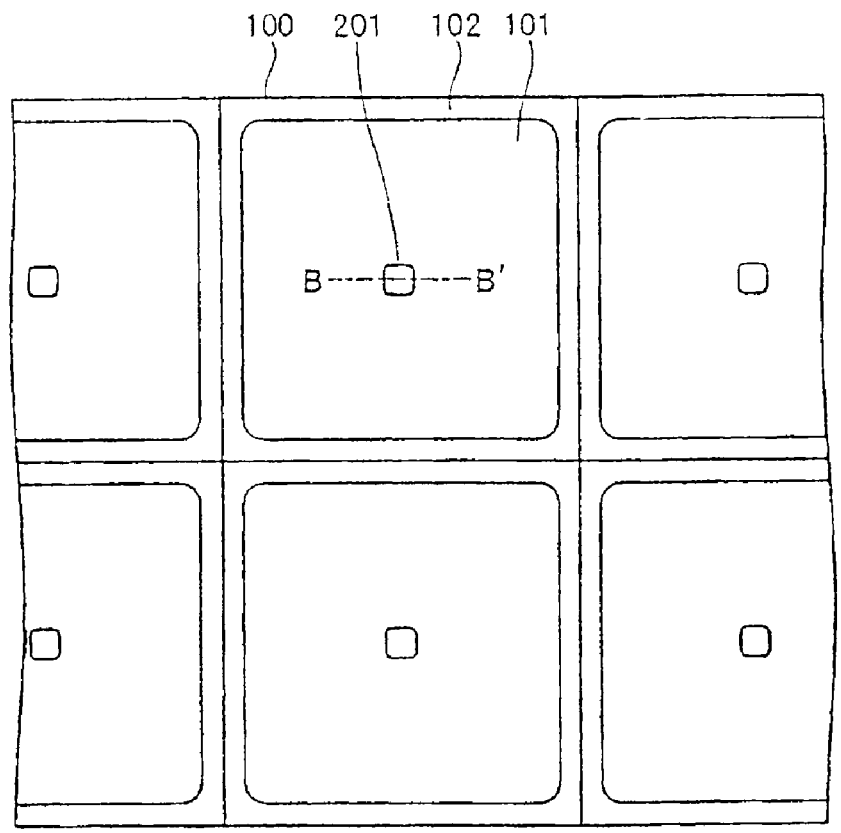
FIG. 9 is a top plan view describing the manufacturing method for manufacturing the semiconductor apparatus according to the first embodiment.
Figure 10:
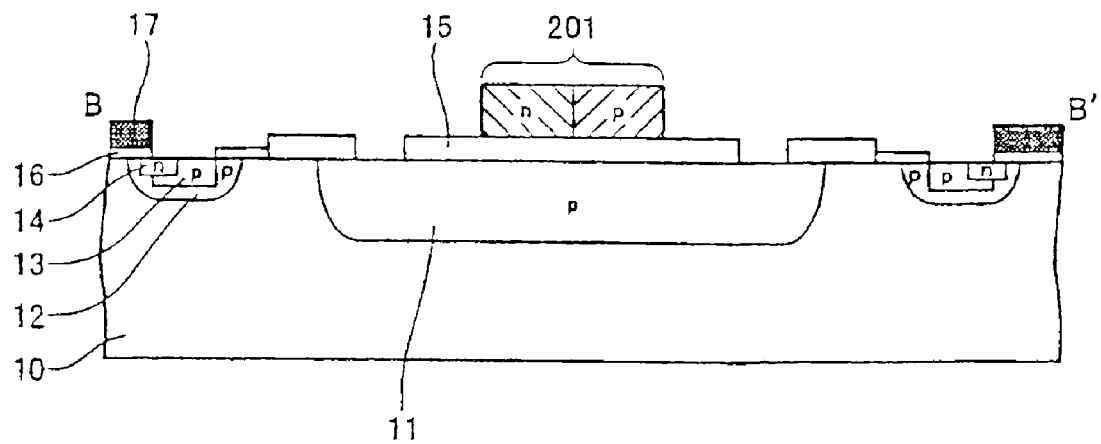
FIG. 10 is a cross sectional view describing the manufacturing method for manufacturing the semiconductor apparatus according to the first embodiment.

Now, the method for manufacturing the semiconductor apparatus according to the first embodiment will be described below. FIGS. 9 through 12 are drawings describing the manufacturing steps for manufacturing the semiconductor apparatus according to the first embodiment. FIG. 9 is a top plan view of the semiconductor apparatus according to the first embodiment on the way of the manufacture thereof. In FIG. 9, the structure of the main semiconductor device is not shown for clearly showing the mounting location of the subsidiary semiconductor device. FIG. 10 is a cross sectional view showing the cross sectional structure along the line segment B-B' in FIG. 9.

As shown in FIG. 9 or 10, the steps before forming an insulator film on single-crystal semiconductor substrate 10 are conducted by the method similar to the method for manufacturing the ordinary IGBT's. In detail, p-type channel region 12, p-type body region 13, n-type emitter region 14, gate oxide film 16, and gate electrode 17 are formed in single-crystal semiconductor substrate 10. In the steps of forming, p-type well region 11 is formed between adjacent p-type channel regions 12 such that p-type well region 11 is spaced apart from p-type channel regions 12.

Then, the position on semiconductor chip 100, at which single-crystal silicon diode 201 is mounted, is detected from the optical images of a mirror projection aligner (hereinafter referred to as an "MPA"), a stepper and such a means. The mounting position of single-crystal silicon diode 201 may be detected with a mechanical stage capable of displaying the xy-coordinates. Then, single-crystal silicon diode 201 is mounted at the detected mounting position.

Single-crystal silicon diode 201 is mounted, for example, on oxide film 15 formed on p-type well region 11. Single-crystal silicon diode 201 is mounted on oxide film 15 with oxide film 4 shown in FIG. 8 underlying. Then, single-crystal silicon diode 201 is pressed against the mounting position thereof on oxide film 15, for example, with a needle-shaped tool additionally disposed on the flank of a robot arm. Single-crystal silicon diode 201 is pressed softly but strongly enough to push out the air left between oxide film 4 on single-crystal silicon diode 201 and oxide film 15 on p-type well region 11. The operation described above makes it difficult for single-crystal silicon diode 201 to come off oxide film 15. Single-crystal silicon diode 201 hardly comes off oxide film 15, since adsorption force is caused between $SiO_2$ in oxide film 4 on single-crystal silicon diode 201 and $SiO2$ in oxide film 15 at the mounting position in the same manner as in the bonded SOI substrate. However, the large characteristics changes, which are often caused by voids and particles in the usual bonded SOI substrates, are hardly caused in bonding single-crystal silicon diode 201 to oxide film 15. Therefore, single-crystal silicon diode 201 is bonded to oxide film 15 without any of the complicated and special treatments as conducted in the bonding treatment using the bonded SOI substrate.

Figure 11:
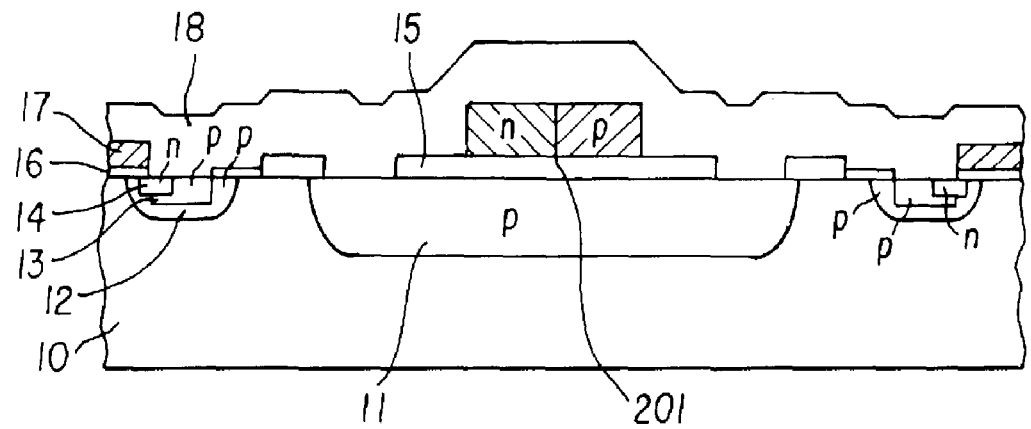
FIG. 11 is a cross sectional view describing the manufacturing step subsequent to the step described in FIG. 10.
Figure 12:
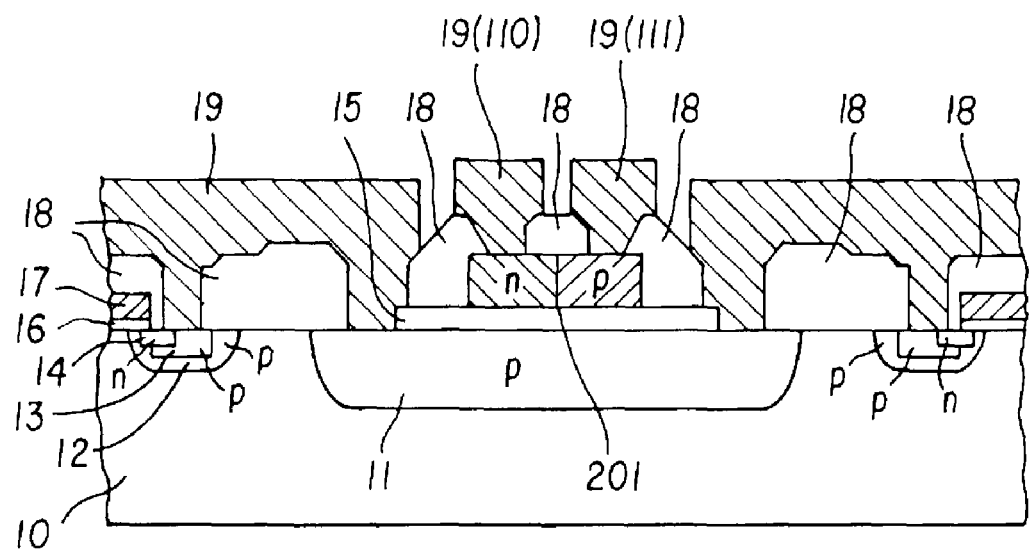
FIG. 12 is a cross sectional view describing the manufacturing step subsequent to the step described in FIG. 11.

Then, insulator film 18 of a BPSG film or a PSG film is formed as shown in FIG. 11. It is preferable for the apparatus for forming insulator film 18 to hold the substrate almost horizontally. However, it is not always necessary to hold the substrate almost horizontally, since single-crystal semiconductor substrate 10 and single-crystal silicon diode 201 are absorbed to each other by the adsorption force between the $SiO_2$ layers. Then, insulator film 18 is patterned as shown in FIG. 12 using a pattern similar to the pattern used in manufacturing the semiconductor apparatus, in which the conventional temperature detector diode is formed.

Then, an aluminum film containing around 1 weight % of silicon is grown, for example, to be 5 μm in thickness. The aluminum film is patterned through photolithographic and etching steps to obtain the designed wiring patterns. Then, a not-shown passivation film is formed. The not-shown passivation film subjects to photolithographic and etching steps. Then, single-crystal semiconductor substrate 10 is polished and etched from the back surface thereof so that single-crystal semiconductor substrate 10 may have a desired thickness. Then, ions are implanted through the polished surface and the implanted atoms are diffused thermally to form a not-shown field stop layer (hereinafter, referred to as an "FS layer") and a not-shown collector layer. Then, a metal film is formed on the back surface of single-crystal semiconductor substrate 10. Thus, a semiconductor apparatus, which includes an IGBT (main semiconductor device) mounting thereon a single-crystal silicon diode (subsidiary semiconductor device) for a temperature detector diode, is completed.

The electrodes for single-crystal silicon diode 201 are formed in the following manner. Anode electrode (anode side wiring) 110 and cathode electrode (cathode side wiring) 111 are formed by dividing metal film 19 on the main semiconductor device by patterning and by connecting the divided metal films 19 to the areas on the single-crystal silicon diode 201, from which insulator film 18 has been removed. Wirings are extended, in the same manner as in the semiconductor apparatus mounting the conventional temperature detector diode thereon, from electrodes 110 and 111 to the predetermined pad positions as shown in FIG. 1.

According to the first embodiment of the invention, a subsidiary semiconductor device is mounted onto a main semiconductor device on the way of the manufacture thereof and fixed to the main semiconductor device through the insulator films thereof. Therefore, the subsidiary semiconductor device can be incorporated into the main semiconductor device by a simple method. Since the subsidiary semiconductor device can be manufactured using a single-crystal semiconductor substrate, the characteristics thereof can be improved as compared with the characteristics of the semiconductor device manufactured using a polycrystalline semiconductor substrate. Since many subsidiary semiconductor devices can be manufactured from one sheet of wafer, the manufacturing costs can be reduced. Since the characteristics of the semiconductor devices can be inspected prior to mounting the subsidiary semiconductor device onto the main semiconductor device, the semiconductor devices, the characteristics thereof are not good, can be removed and the non-defective rate of the semiconductor apparatuses can be improved.

Although the subsidiary semiconductor device according to the first embodiment is manufactured using a single-crystal semiconductor substrate, the subsidiary semiconductor device may be manufactured using a polycrystalline semiconductor substrate with no problem. According to the first embodiment, one single-crystal silicon diode is mounted exemplary for a subsidiary semiconductor device onto a main semiconductor device. Alternatively, a plurality of diodes connected in series may be mounted for a subsidiary semiconductor device onto a main semiconductor device with no problem. In the above-described alternative case, the dicing in the manufacturing process of the single-crystal silicon diode may be conducted in such a manner that a plurality of diodes is connected in series.

Figure 13:
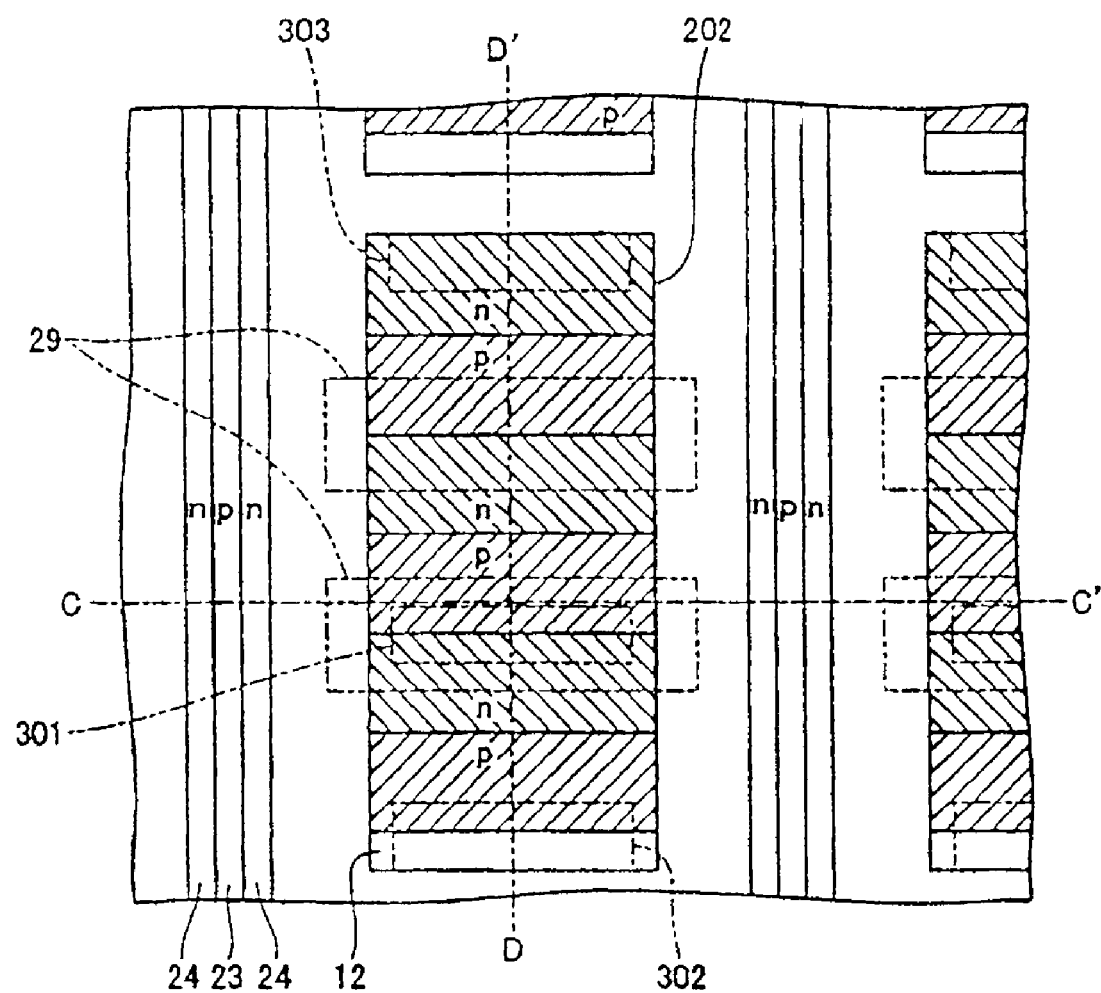
FIG. 13 is a top plan view of a semiconductor apparatus according to a second embodiment of the invention.
Figure 14:
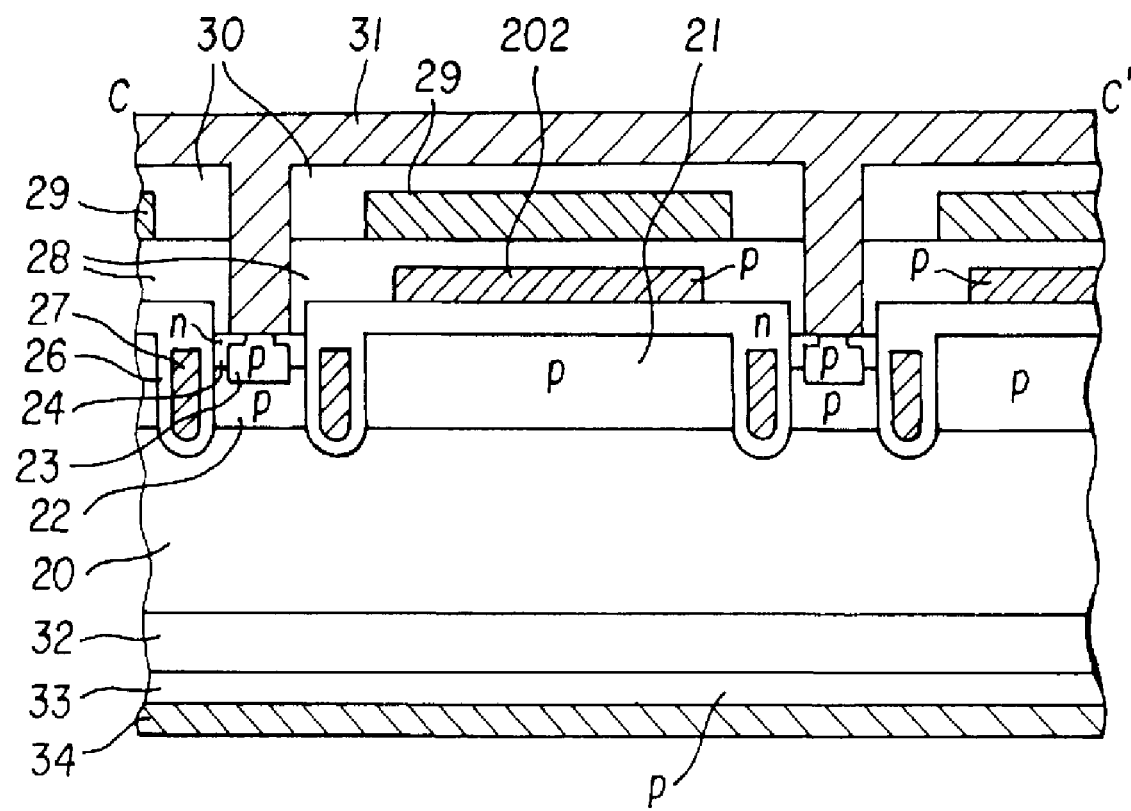
FIG. 14 is a cross sectional view showing the cross sectional structure along the line segment C-C' in FIG. 13.
Figure 15:
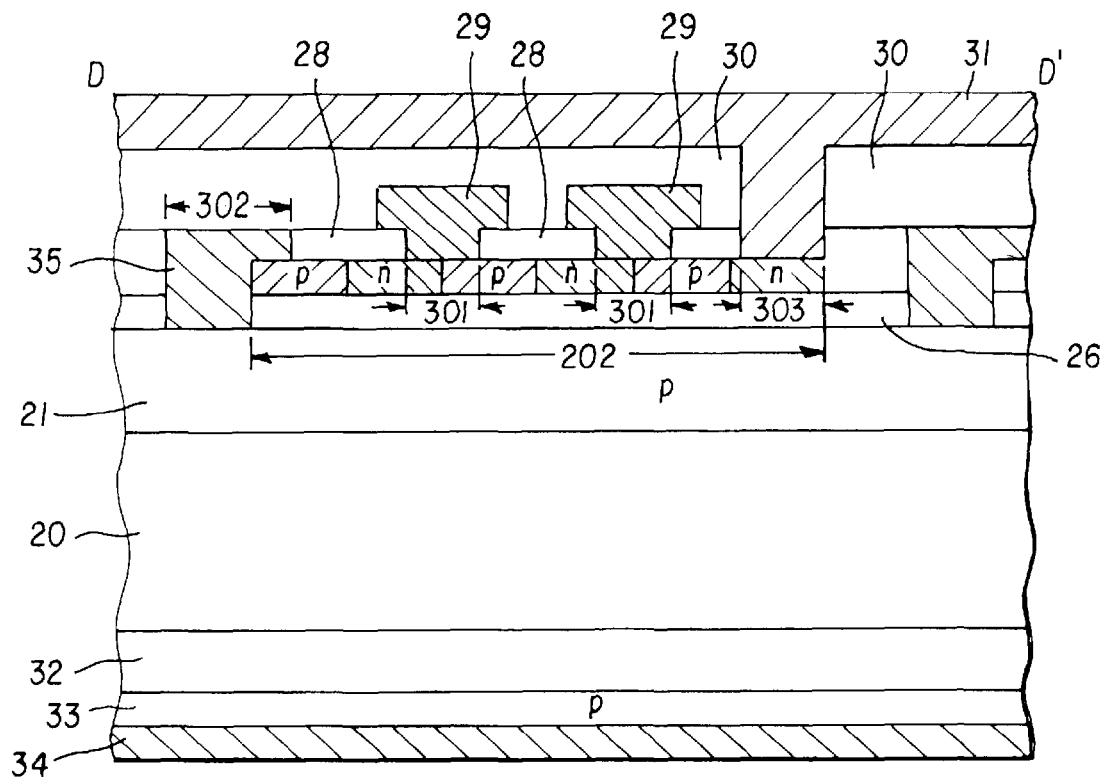
FIG. 15 is a cross sectional view showing the cross sectional structure along the line segment D-D' in FIG. 13.

Now the structure of a semiconductor apparatus according to a second embodiment of the invention will be described below. FIG. 13 is a top plan view of a semiconductor apparatus according to the second embodiment of the invention. FIG. 14 is a cross sectional view showing the cross sectional structure along the line segment C-C' in FIG. 13. FIG. 15 is a cross sectional view showing the cross sectional structure along the line segment D-D' in FIG. 13. As shown in FIGS. 13 through 15, the semiconductor apparatus according to the second embodiment includes an IGBT as a main semiconductor device and a diode for carrier ejection as a subsidiary semiconductor device. The subsidiary semiconductor device according to the second embodiment is described exemplary by three single-crystal silicon diode 202 consisting of three pn-diodes connected in series (hereinafter referred to simply as a "three diode 202"). Emitter electrode 31, second insulator film 30, floating electrode 29, and first insulator film 28 shown in FIG. 14 or 15 are not shown in FIG. 13 for clearly illustrating the subsidiary semiconductor device.

In the semiconductor apparatus according to the second embodiment, the IGBT for the main semiconductor device is an IGBT of a trench-gate type. In detail, the subsidiary semiconductor device is disposed in the region in the main semiconductor device separated by trenches. As shown in FIGS. 13 through 15, the main semiconductor device is manufactured using single-crystal semiconductor substrate 20. In the surface portion of single-crystal semiconductor substrate 20, p-type floating region 21 and p-type channel region 22 are formed. Regions 20 and 21 are spaced apart from each other for a trench. P-type body region 23 and n-type emitter region 24 are formed such that regions 23 and 24 are in contact with p-type channel region 22. Gate electrode 27 is buried in the trench with gate oxide film 26 interposed between gate electrode 27 and the trench inner wall. Emitter electrode 31 is formed on p-type body region 23 and n-type emitter region 24.

Three diode 202 is disposed above p-type floating region 21 with an oxide film continuing from gate oxide film 26 interposed between p-type floating region 21 and three diode 202. Three diode 202 is covered with first insulator film 28. Floating electrode 29 is disposed on first insulator film 28. Floating electrode 29 is covered with second insulator film 30 and separated from emitter electrode 31.

First opening 301, second opening 302, and third opening 303 are formed through first insulator film 28. Three diode 202 and floating electrode 29 are connected electrically to each other in first opening 301. Second opening 302 is formed also through the insulator film continuing from gate oxide film 26. In second opening 302, three diode 202 and p-type floating region 21 are connected electrically to each other via connector electrode 35. In third opening 303, three diode 202 and emitter electrode 31 are connected electrically to each other.

Figure 16:
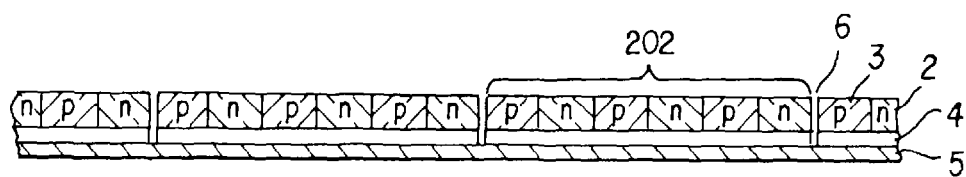
FIG. 16 is a cross sectional view describing the method for manufacturing a three single-crystal silicon diode consisting of three pn-diodes connected in series to each other.

Now the method for manufacturing three diode 202 will be described below. FIG. 16 is a cross sectional view describing the method for manufacturing three diode 202. As shown in FIG. 16, heavily doped n-type regions 2 and heavily doped p-type regions 3 are formed alternately at intervals of 5 to 10 μm in the same manner as in the first embodiment of the invention. Then, dicing is conducted in a rectangular pattern such that three pn-diodes are connected in series. Thus, a three diode is completed.

Figure 17:
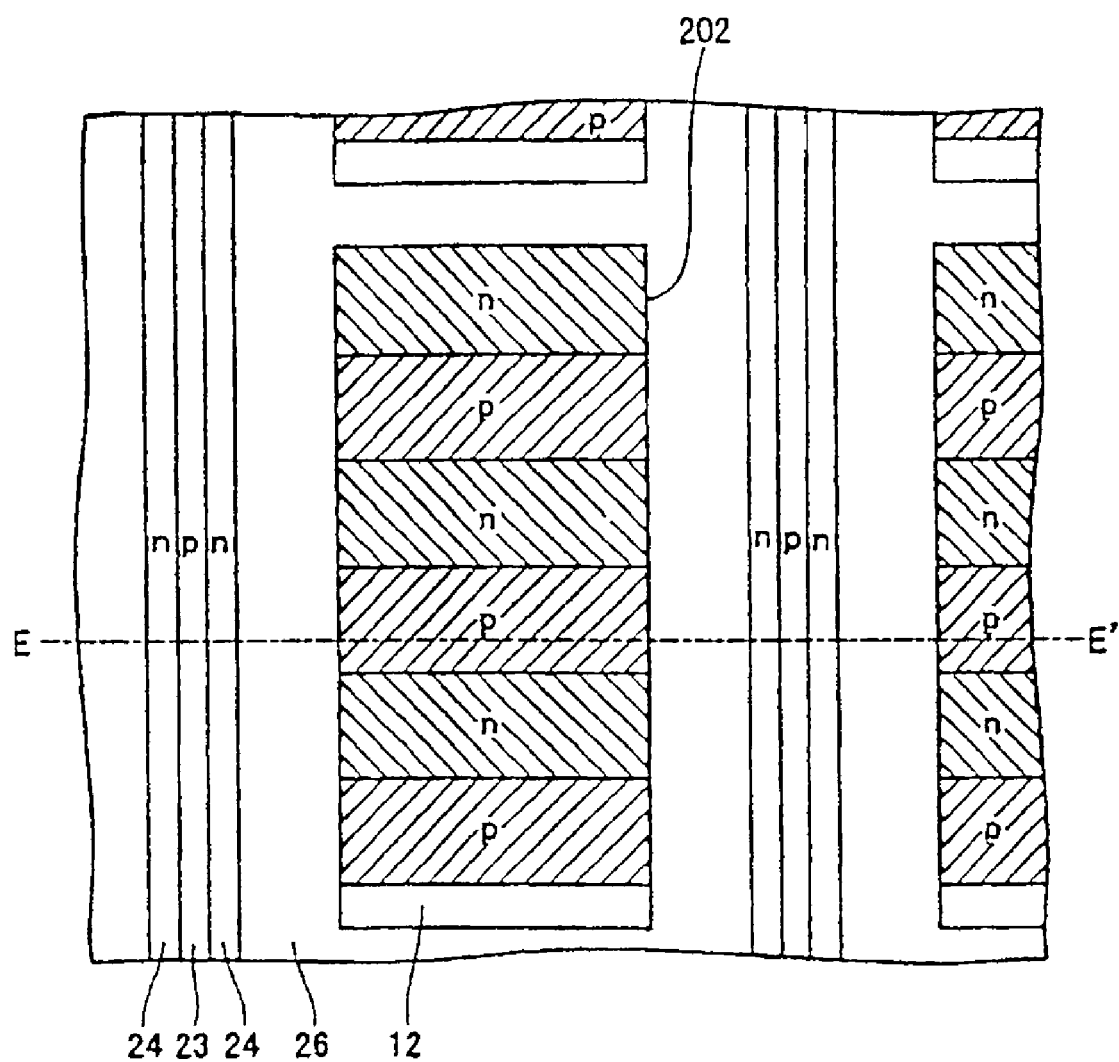
FIG. 17 is a top plan view showing the structure of the semiconductor apparatus according to the second embodiment on the way of the manufacture thereof.
Figure 18:
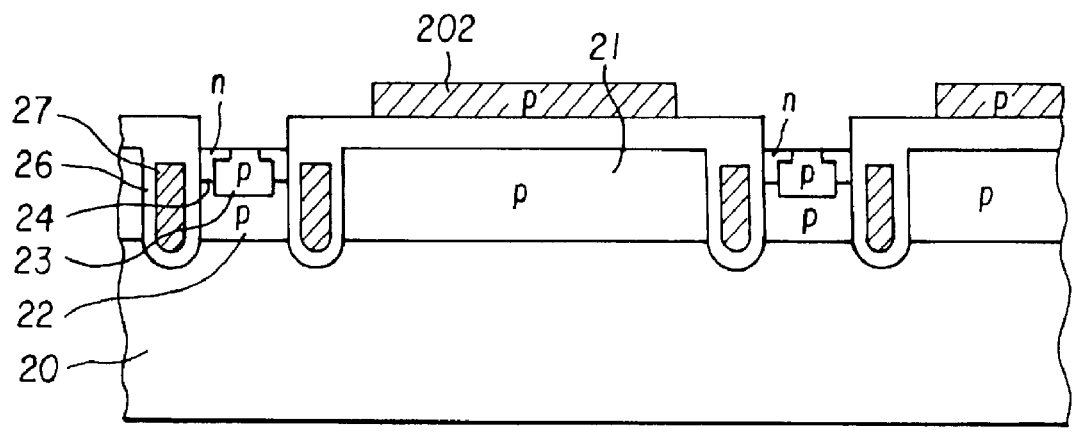
FIG. 18 is a cross sectional view describing a manufacturing step for manufacturing the semiconductor apparatus according to the second embodiment.

Now the method for manufacturing the semiconductor apparatus according to the second embodiment will be described below. FIGS. 17 through 23 are drawings describing the method for manufacturing the semiconductor apparatus according to the second embodiment in the order of the manufacturing steps. FIG. 17 is a top plan view showing the structure of the semiconductor apparatus according to the second embodiment on the way of the manufacture thereof. In FIG. 17, the structure of the main semiconductor device is not shown for clearly showing the mounting location of the subsidiary semiconductor device. FIG. 18 is a cross sectional view showing the cross sectional structure along the line segment E-E' in FIG. 17.

The steps before the step of forming an insulator layer on single-crystal semiconductor substrate 20 are conducted as shown in FIG. 17 or 18 in the same manner as in the method for manufacturing usual trench-gate IGBT's. In detail, p-type channel region 22, p-type body region 23, n-type emitter region 24, and trenches are formed in single-crystal semiconductor substrate 20. In the surface portion of single-crystal semiconductor substrate 20 spaced apart for a trench from the surface portion of single-crystal semiconductor substrate 20, in which p-type channel region 22 is formed, p-type floating region 21 is formed. In forming gate oxide film 26 in the trench, the oxide film continuous to gate oxide film 26 is formed also on p-type floating region 21. Then, gate electrode 27 is formed on gate oxide film 26 in the trench. Then, the mounting positions of three diodes 202 is detected in the same manner as according to the first embodiment with an MPA or with a stepper. Then, three diodes 202 are mounted on the detected mounting position.

Figure 19:
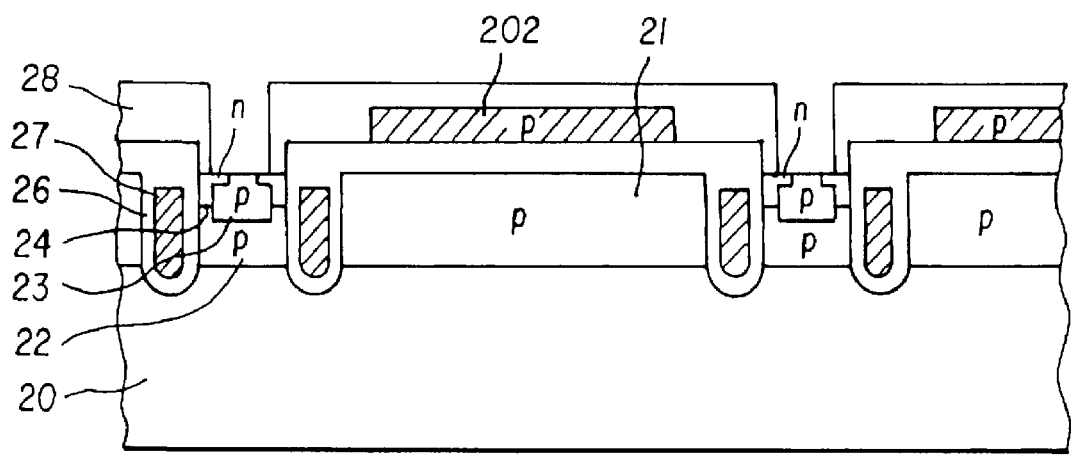
FIG. 19 is a cross sectional view describing the manufacturing step subsequent to the manufacturing step described in FIG. 18.
Figure 20:
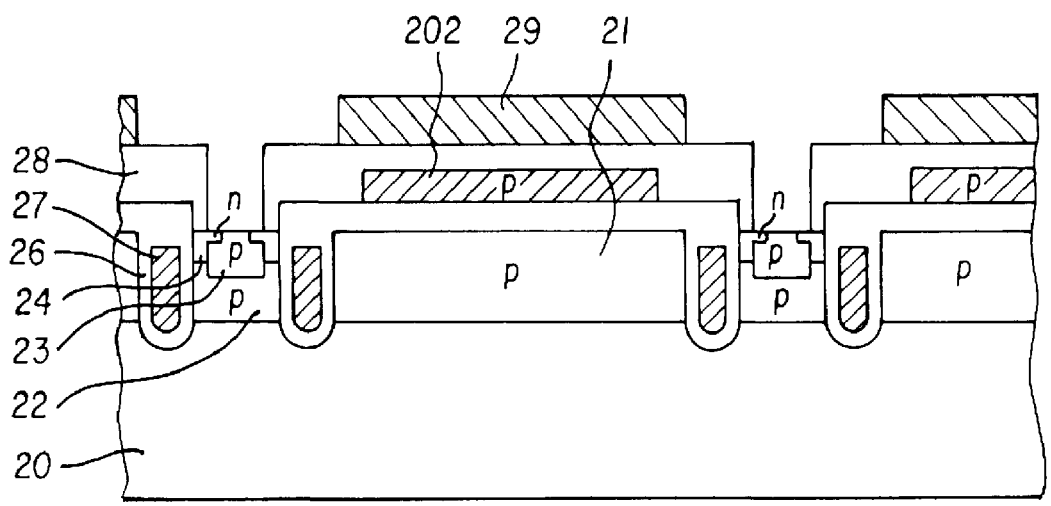
FIG. 20 is a cross sectional view describing the manufacturing step subsequent to the manufacturing step described in FIG. 19.
Figure 21:
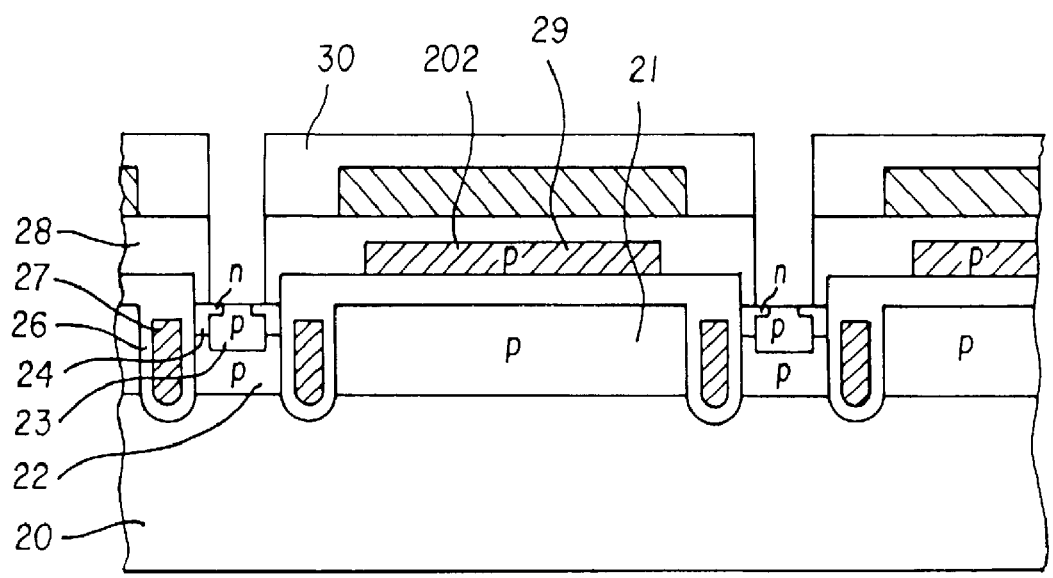
FIG. 21 is a cross sectional view describing the manufacturing step subsequent to the manufacturing step described in FIG. 20.
Figure 22:
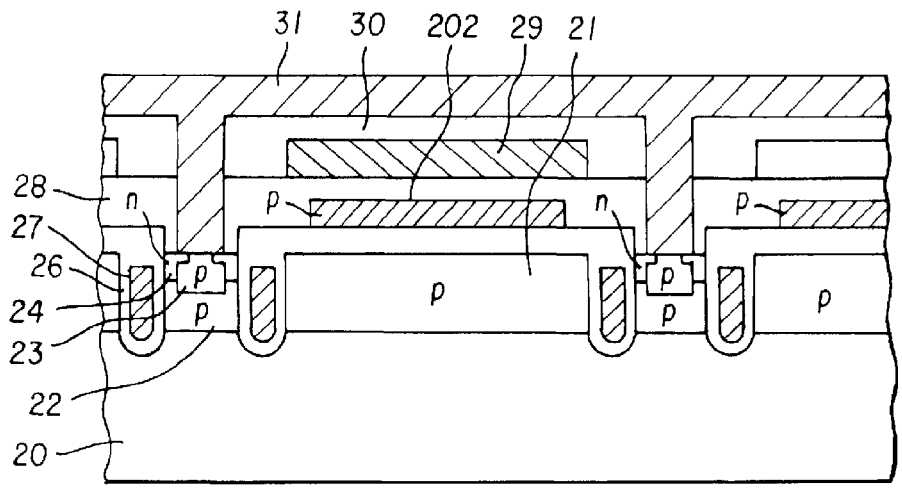
FIG. 22 is a cross sectional view describing the manufacturing step subsequent to the manufacturing step described in FIG. 21.

Then, first insulator film 28 is formed such that first insulator film 28 covers three diode 202 as shown in FIG. 19. Photolithographic and etching steps are conducted to form openings at the predetermined positions in first insulator film 28. Then, floating electrode 29 is formed on second insulator film 28 as shown in FIG. 20. Then, second insulator film 30 is formed such that second insulator film 30 covers floating electrode 29 as shown in FIG. 21. Photolithographic and etching steps are conducted to form openings at the predetermined positions in second insulator film 30. Then, emitter electrode 31 is formed on p-type body region 23, n-type emitter region 24, and second insulator film 30 as shown in FIG. 22.

Figure 23:
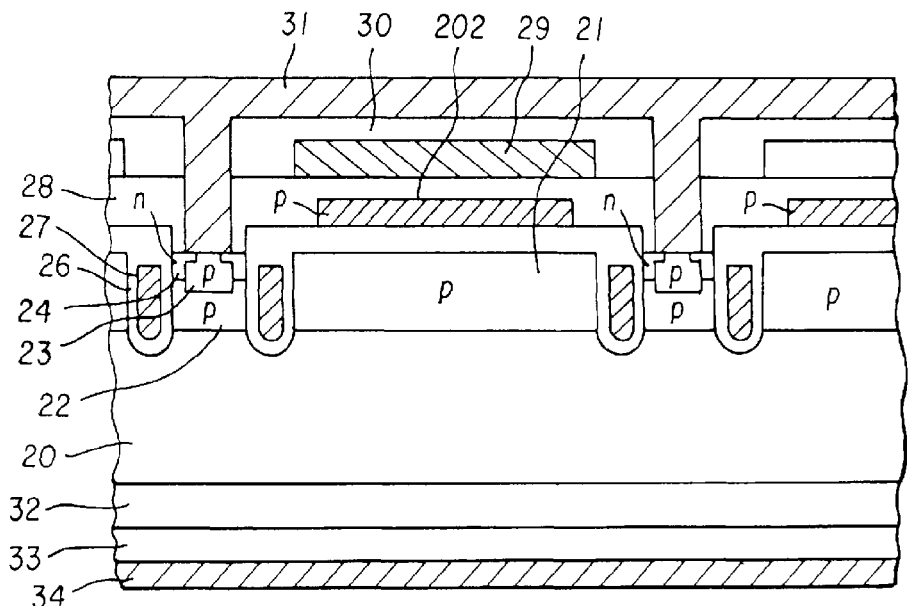
FIG. 23 is a cross sectional view describing the manufacturing step subsequent to the manufacturing step described in FIG. 22.

Then, single-crystal semiconductor substrate 20 is polished and etched from the back surface thereof such that single-crystal semiconductor substrate 20 has a predetermined thickness as shown in FIG. 23. Then, FS layer 32 and p-type collector layer 33 are formed on the polished surface. Then, a not-shown passivation film is formed on the front surface of single-crystal semiconductor substrate 20 and photolithographic and etching steps are conducted. Further, back electrode film 34 is formed on the back surface of single-crystal semiconductor substrate 20. Thus, the semiconductor apparatus according to the second embodiment is completed.

The manufacturing method according to the second embodiment exhibits the same effects same with the effects that the manufacturing method according to the first embodiment exhibits. Since it is possible to provide a main semiconductor device with a subsidiary semiconductor device other than the temperature detector diode, the freedom of designing a semiconductor apparatus is improved.

Figure 24:
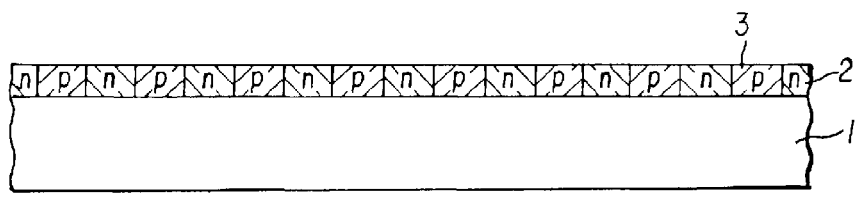
FIG. 24 is a cross sectional view describing the manufacturing step for manufacturing a subsidiary semiconductor device mounted on a semiconductor apparatus according to a third embodiment of the invention.
Figure 25:
FIG. 25 is a cross sectional view describing the manufacturing step subsequent to the manufacturing step described in FIG. 24.
Figure 26:
FIG. 26 is a cross sectional view describing the manufacturing step subsequent to the manufacturing step described in FIG. 25.

Now the method for manufacturing a semiconductor apparatus according to a third embodiment of the invention will be described below. The method for manufacturing a semiconductor apparatus according to the third embodiment is different from the methods for manufacturing the semiconductor apparatuses according to the first and second embodiments in that the diode mounted for a subsidiary semiconductor device is manufactured by a different method different from those according to the first and second embodiments. FIGS. 24 through 26 are cross sectional views describing the manufacturing steps for manufacturing a subsidiary semiconductor device mounted on a semiconductor apparatus according to the third embodiment. Referring now to these drawings, n-type regions 2 and p-type regions 3 are formed alternately on the front surface of single-crystal semiconductor substrate 1 but any oxide film is not formed thereon. Single-crystal semiconductor substrate 1 with n-type regions 2 and p-type regions 3 formed thereon is left in an oxidizing atmosphere.

First, n-type cathode regions 2 and p-type anode regions 3 are formed alternately on the front surface of single-crystal semiconductor substrate 1 with a center to center distance of, for example, 125 µm between the adjacent n-type cathode region 2 and p-type anode region 3 as shown in FIG. 24. Then, tape 5 is adhered to the front surface of single-crystal semiconductor substrate 1. Single-crystal semiconductor substrate 1 is polished or etched from the back surface thereof such that n-type cathode regions 2 or p-type anode regions 3 are 10 µm or less in thickness as shown in FIG. 25. Then, single-crystal semiconductor substrate 1 polished or etched is left in an oxidizing atmosphere to form a thin oxide film on the surfaces of n-type cathode regions 2 and p-type anode regions 3 on the side opposite to the side of n-type cathode regions 2 and p-type anode regions 3, on which tape 5 is adhered.

Then, dicing is conducted in the same manner as according to the first embodiment as shown in FIG. 26. According to the third embodiment, single-crystal silicon diode 203 peeled off is mounted on a main semiconductor device with the surface, on which the thin oxide film is formed, underlying. By positioning single-crystal silicon diode 203 as described above, the thin oxide film on single-crystal silicon diode 203 and the oxide film formed on the substrate of the main semiconductor device are adsorbed to each other by the adsorption force between $SiO_2$, resulting in improved adhesiveness. Since the other steps are conducted in the same manner as according to the first or second embodiment, their descriptions will not be repeated.

The manufacturing method according to the third embodiment exhibits the same effects same with the effects, which the manufacturing methods according to the first and second embodiments exhibit. Since the step of forming an oxide film on one surface of the diode in manufacturing a subsidiary semiconductor device can be omitted according to the third embodiment, the throughput is improved.

Now the method for manufacturing a semiconductor apparatus according to a fourth embodiment of the invention will be described below. According to the fourth embodiment, a subsidiary semiconductor device is manufactured using gallium nitride (GaN) not in the same manner as according to the first through third embodiments.

Figure 27:
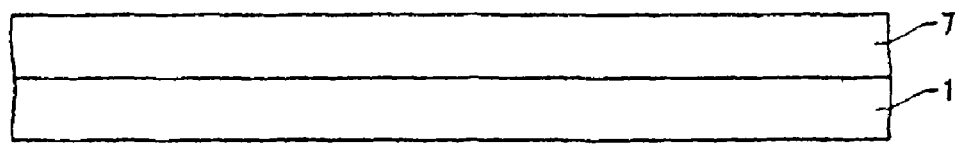
FIG. 27 is a cross sectional view describing a first manufacturing step for manufacturing a subsidiary semiconductor device mounted on a semiconductor apparatus according to a fourth embodiment of the invention.
Figure 28:
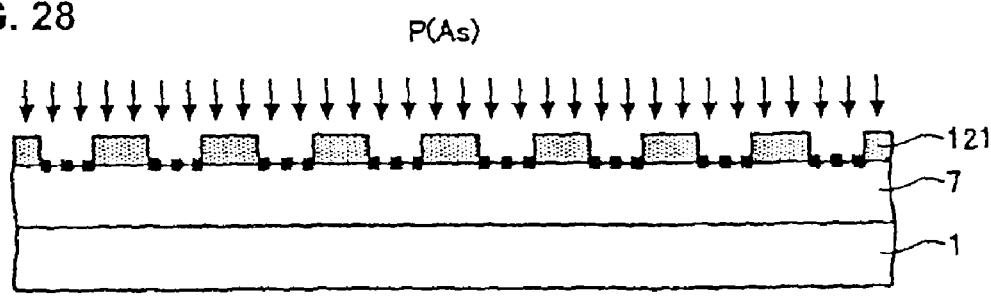
FIG. 28 is a cross sectional view describing the manufacturing step subsequent to the step described in FIG. 27.
Figure 29:
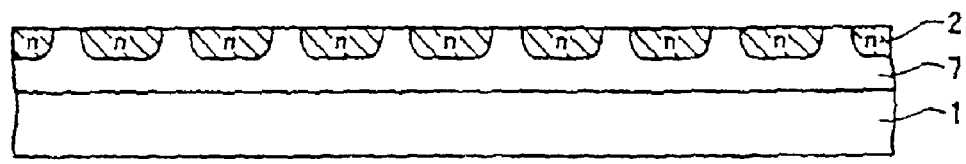
FIG. 29 is a cross sectional view describing the manufacturing step subsequent to the step described in FIG. 28.

FIGS. 27 through 31 are cross sectional views describing the manufacturing steps for manufacturing a subsidiary semiconductor device mounted on a semiconductor apparatus according to the fourth embodiment of the invention in the order of the manufacture. First, GaN layer 7 is grown in an epitaxial manner on the front surface of single-crystal semiconductor substrate 1 as shown in FIG. 27. As shown in FIG. 28, first resist mask 121 is formed in the same manner as according to the first through third embodiments and ion implantation is conducted. As shown in FIG. 29, heavily doped n-type cathode regions 2 are formed in GaN layer 7 with equal spaces of, for example, 125 µm left between n-type cathode regions 2.

Figure 30:
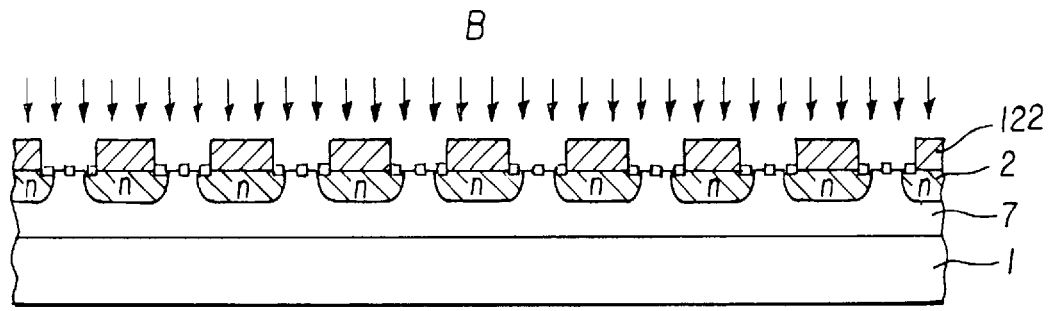
FIG. 30 is a cross sectional view describing the manufacturing step subsequent to the step described in FIG. 29.
Figure 31:
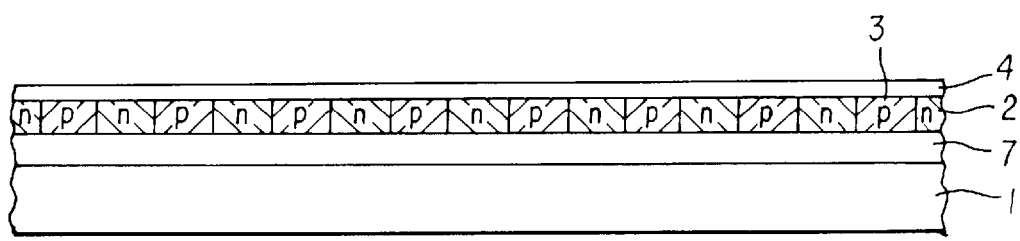
FIG. 31 is a cross sectional view describing the manufacturing step subsequent to the step described in FIG. 30.

As shown in FIG. 30, second resist mask 122 is formed in the same manner as according to the first embodiment and ion implantation is conducted. As shown in FIG. 31, heavily doped p-type anode regions 3 are formed between n-type cathode regions 2. Through the steps described above, n-type cathode regions 2 and p-type anode regions 3 are formed alternately at a center to center distance of 125 µm between the adjacent n-type cathode region 2 and p-type anode region 3. Then, oxide film 4 is formed on GaN layer 7. Then, single-crystal semiconductor substrate 1 is polished or etched from the back surface thereof such that the total thickness of oxide film 4 and n-type cathode region 2 or p-type anode region 3 has a predetermined value. Further, dicing is conducted to complete a single-crystal GaN diode made of GaN.

The built-in potential of a pn-diode depends on the band gap of the semiconductor making the diode. In detail, the built-in potential of a pn-diode employing a semiconductor exhibiting a wide band gap is higher than the built-in potential of a pn-diode employing a semiconductor exhibiting a narrow band gap. The band gap of silicon is about 1.1 eV while the band gap of GaN is about 3.4 eV much wider than the band gap of silicon. Therefore, the built-in potential of a diode manufactured using GaN is higher than the built-in potential of a diode manufactured using silicon.

Although the band gaps of SiC are different depending on the crystal structures thereof, the band gap of 4H SiC is about 3.3 eV. The band gap of diamond is about 5.5 eV. Therefore, the built-in potential of a diode manufactured using SiC or diamond is higher than the built-in potential of a diode manufactured using silicon.

For mounting a subsidiary semiconductor device on an IGBT manufactured using a silicon substrate including a p-type floating layer (p-type well layer), it is necessary for the built-in potential of the subsidiary semiconductor device to be several times as high as the built-in potential of the collector region and base region in the IGBT or the built-in potential of the FS layer and buffer layer in the IGBT. The built-in potential of a diode manufactured using GaN is about three times as high as the built-in potential of a semiconductor device manufactured using silicon (a main semiconductor device such as an IGBT). Therefore, it is not necessary to connect a plurality of diodes in series for forming a subsidiary semiconductor device.

Figure 32:
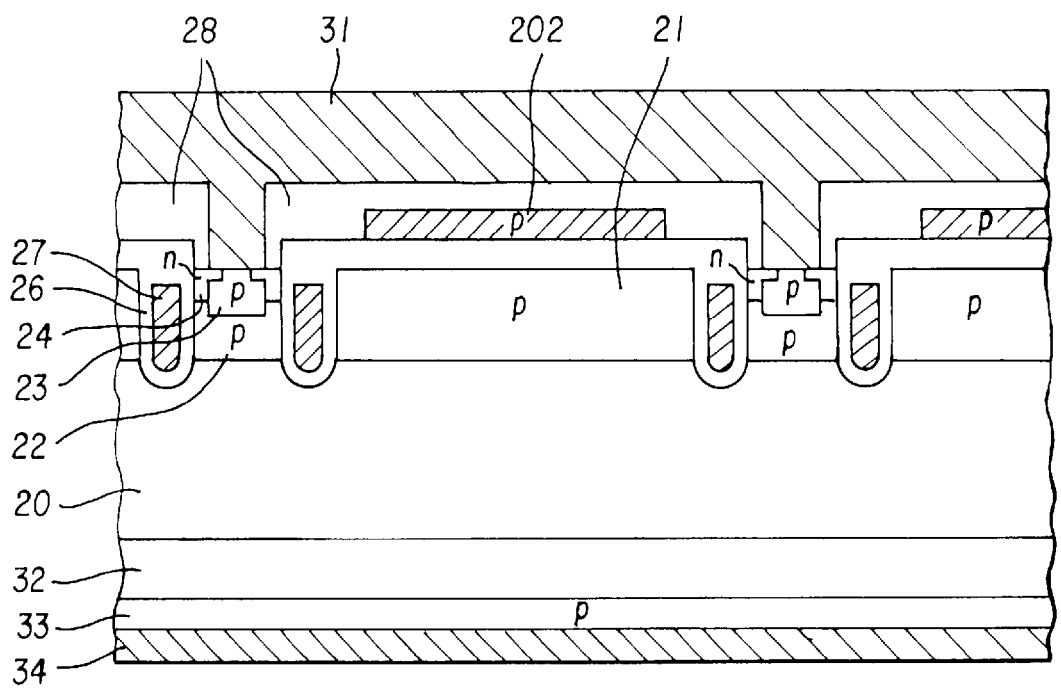
FIG. 32 is a cross sectional view describing the structure of the semiconductor apparatus according to the fourth embodiment.

FIG. 32 is a cross sectional view describing the structure of the semiconductor apparatus according to the fourth embodiment. In FIG. 32, the subsidiary semiconductor device in the semiconductor apparatus according to the second embodiment is replaced by a single-crystal GaN diode. By employing the subsidiary semiconductor device according to the fourth embodiment for the subsidiary semiconductor device in the semiconductor apparatus according to the second embodiment, it becomes unnecessary to form second insulator film 30 and floating electrode 29 as shown in FIG. 32.

The manufacturing method according the fourth embodiment exhibits the same effects same with the effects, which the manufacturing methods according the first through third embodiment exhibit. The built-in potential of the subsidiary semiconductor device is set to be several times as high as the built-in potential of the main semiconductor device according the fourth embodiment. Therefore, the floating electrode and some insulator films may be omitted and the structure of the subsidiary semiconductor device is simplified. As a result, the manufacturing process is simplified and the throughput of non-defective products is improved.

As described above, the manufacturing method according to the invention is very useful for manufacturing a semiconductor apparatus including a main semiconductor device and a subsidiary semiconductor device incorporated into the main semiconductor device. Especially, the manufacturing method according to the invention is well suited for manufacturing power semiconductor apparatuses used, for example, in power converters.

The invention has been described with reference to certain preferred embodiments thereof. It will be understood, however, that modifications are possible within the scope of the appended claims.

This application is based on and claims priority to Japanese Patent Application 2008-134691, filed on May 22, 2008. The disclosure of the priority application in its entirety, including the drawings, claims, and the specification thereof, is incorporated herein by reference.

What is claimed is:

1. A method for manufacturing a semiconductor apparatus comprising a main semiconductor device and a subsidiary semiconductor device provided for the main semiconductor device in a subordinate or additional manner; the method comprising:
   (a) mounting the subsidiary semiconductor device on a substrate of the main semiconductor device; and
   (b) conducting a common treatment to the main semiconductor device and the subsidiary semiconductor device in a state, in which the subsidiary semiconductor device is on the main semiconductor device, for fixing the subsidiary semiconductor device to the main semiconductor device, wherein the common treatment includes forming an insulator film on the main semiconductor device and the subsidiary semiconductor device, and fixing the subsidiary semiconductor device to the main semiconductor device through the insulator film and the subsidiary semiconductor device is covered with the insulator film.

2. The method according to claim 1, further comprising forming a metal film on the main semiconductor device and the subsidiary semiconductor device after the common treatment is conducted.

3. The method according to claim 1, further comprising implanting ions to the substrate and thermally treating the substrate for forming semiconductor regions of predetermined conductivity types constituting the main semiconductor device prior to mounting the subsidiary semiconductor device on a substrate of the main semiconductor device.

4. The method according to claim 1, wherein the main semiconductor device and the subsidiary semiconductor device comprise a single crystal semiconductor.

5. The method according to claim 1, wherein the main semiconductor device comprises an insulated gate bipolar transistor.

6. The method according to claim 1, wherein the subsidiary semiconductor device comprises a diode.

7. The method according to claim 1, wherein the subsidiary semiconductor device comprises a diode for temperature detection.

8. The method according to claim 1, wherein the subsidiary semiconductor device comprises a diode that assists the main semiconductor device in ejecting excess carriers therefrom.

9. A method for manufacturing a semiconductor apparatus comprising a main semiconductor device and a subsidiary semiconductor device provided for the main semiconductor device in a subordinate or additional manner; the method comprising:
   (a) mounting the subsidiary semiconductor device on a substrate of the main semiconductor device; and
   (b) conducting a common treatment to the main semiconductor device and the subsidiary semiconductor device in a state, in which the subsidiary semiconductor device is on the main semiconductor device, for fixing the subsidiary semiconductor device to the main semiconductor device, further comprising forming a metal film on the main semiconductor device and the subsidiary semiconductor device after the common treatment is conducted, and further comprising forming openings at predetermined positions in the insulator film, wherein the openings are formed after the common treatment is conducted and before the metal film is formed on the main semiconductor device and the subsidiary semiconductor device, and wherein the main semiconductor device and a part of the subsidiary semiconductor device are connected electrically to each through the openings.

10. A method for manufacturing a semiconductor apparatus comprising a main semiconductor device and a subsidiary semiconductor device provided for the main semiconductor device in a subordinate or additional manner; the method comprising:
(a) mounting the subsidiary semiconductor device on a substrate of the main semiconductor device; and
(b) conducting a common treatment to the main semiconductor device and the subsidiary semiconductor device in a state, in which the subsidiary semiconductor device is on the main semiconductor device, for fixing the subsidiary semiconductor device to the main semiconductor device, further comprising forming an oxide film on the substrate in advance of mounting the subsidiary semiconductor device on a substrate of the main semiconductor device, and wherein the mounting of the subsidiary semiconductor device, which includes a surface on which an oxide film is formed, includes positioning the oxide film formed on the surface of the subsidiary semiconductor device in contact with the oxide film formed on the substrate.

11. A method for manufacturing a semiconductor apparatus comprising a main semiconductor device and a subsidiary semiconductor device provided for the main semiconductor device in a subordinate or additional manner; the method comprising:
(a) mounting the subsidiary semiconductor device on a substrate of the main semiconductor device; and
(b) conducting a common treatment to the main semiconductor device and the subsidiary semiconductor device in a state, in which the subsidiary semiconductor device is on the main semiconductor device, for fixing the subsidiary semiconductor device to the main semiconductor device,
further comprising implanting ions to the substrate and thermally treating the substrate for forming semiconductor regions of predetermined conductivity types constituting the main semiconductor device prior to mounting the subsidiary semiconductor device on a substrate of the main semiconductor device, and
further comprising forming an oxide film on the substrate after the ion implantation and in advance of mounting the subsidiary semiconductor device on a substrate of the main semiconductor device, and wherein the mounting of the subsidiary semiconductor device, which includes a surface on which an oxide film is formed, includes positioning the oxide film formed on the surface of the subsidiary semiconductor device in contact with the oxide film formed on the substrate.

12. A method for manufacturing a semiconductor apparatus comprising a main semiconductor device and a subsidiary semiconductor device provided for the main semiconductor device in a subordinate or additional manner; the method comprising:
(a) mounting the subsidiary semiconductor device on a substrate of the main semiconductor device; and
(b) conducting a common treatment to the main semiconductor device and the subsidiary semiconductor device in a state, in which the subsidiary semiconductor device is on the main semiconductor device, for fixing the subsidiary semiconductor device to the main semiconductor device, further comprising polishing and etching the substrate from a back surface side thereof in order to thin the substrate after the common treatment is conducted.

13. A method for manufacturing a semiconductor apparatus comprising a main semiconductor device and a subsidiary semiconductor device provided for the main semiconductor device in a subordinate or additional manner; the method comprising:
(a) mounting the subsidiary semiconductor device on a substrate of the main semiconductor device; and
(b) conducting a common treatment to the main semiconductor device and the subsidiary semiconductor device in a state, in which the subsidiary semiconductor device is on the main semiconductor device, for fixing the subsidiary semiconductor device to the main semiconductor device,
further comprising forming a metal film on the main semiconductor device and the subsidiary semiconductor device after the common treatment is conducted, and
further comprising polishing and etching the substrate from a back surface side thereof in order to thin the substrate after the metal film is formed.

14. A method for manufacturing a semiconductor apparatus comprising a main semiconductor device and a subsidiary semiconductor device
provided for the main semiconductor device in a subordinate or additional manner; the method comprising:
(a) mounting the subsidiary semiconductor device on a substrate of the main semiconductor device; and
(b) conducting a common treatment to the main semiconductor device and the subsidiary semiconductor device in a state, in which the subsidiary semiconductor device is on the main semiconductor device, for fixing the subsidiary semiconductor device to the main semiconductor device, wherein the main semiconductor device and the subsidiary semiconductor device comprise different semiconductor materials.

15. The method according to claim 14, wherein a band gap of the subsidiary semiconductor device is wider than a band gap of the main semiconductor device.

* * * * *